(12) United States Patent
Baumgartner et al.

(10) Patent No.: US 6,208,152 B1
(45) Date of Patent: Mar. 27, 2001

(54) REDUNDANT RESISTOR MATCHING DETECTOR WITH CONSTANT PERCENTAGE THRESHOLD

(75) Inventors: Steven John Baumgartner, Zumbro Falls; Kevin Paul Demsky, Rochester, both of MN (US); Raymond Jonathan Thatcher, Longmont, CO (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/418,545

(22) Filed: Oct. 14, 1999

(51) Int. Cl.[7] .............................. G01R 19/00; G01R 27/08
(52) U.S. Cl. ..................... 324/705; 324/705; 324/723; 327/66
(58) Field of Search ................................ 324/705, 723; 327/66

(56) References Cited

U.S. PATENT DOCUMENTS

| | | | |
|---|---|---|---|
| 3,990,019 | * 11/1976 | Crockett et al. | 330/207 P |
| 4,922,131 | * 5/1990 | Anderson et al. | 327/66 |
| 5,483,190 | * 1/1996 | McGivern | 327/334 |
| 5,596,268 | * 1/1997 | Strong et al. | 324/71.1 |
| 5,936,970 | * 8/1999 | Lee | 714/710 |

* cited by examiner

Primary Examiner—Safet Metjahic
Assistant Examiner—Wasseem H. Hamdan
(74) Attorney, Agent, or Firm—Joan Pennington

(57) ABSTRACT

A redundant resistor matching detector is provided with constant percentage threshold. The redundant resistor matching detector includes a voltage reference and a first operational amplifier, a second operational amplifier, a first potentiometer and a reference potentiometer. The first operational amplifier has a first input connected to a first potentiometer. The second operational amplifier has a first input connected to the reference potentiometer. The first operational amplifier and the second operational amplifier have a reference input coupled to the voltage reference. An input current mirror is coupled to the first potentiometer providing a first current. A first reference current mirror is coupled to the reference potentiometer providing a reference current. A second reference current mirror has an input coupled to a first output of the first reference current mirror and has a first output coupled to an output of the input current mirror. A pair of series connected resistors are connected between a second output of both the first reference current mirror and the second reference current mirror. A resistor is connected between a junction of the pair of series connected resistors and the first outputs of the input current mirror and the second reference current mirror.

12 Claims, 1 Drawing Sheet

REDUNDANT RESISTOR MATCHING DETECTOR WITH CONSTANT PERCENTAGE THRESHOLD

FIELD OF THE INVENTION

The present invention relates to a redundant resistor matching detector with constant percentage threshold.

DESCRIPTION OF THE RELATED ART

A problem exists where a redundant resistor is needed to reference the accuracy of a functional resistor to within a fixed percentage of the redundant resistor. A redundant resistor is needed was needed since a digital potentiometer implementation for the resistor had several failure mechanisms that needed to be detected.

SUMMARY OF THE INVENTION

A principal object of the present invention is to provide an improved redundant resistor matching detector. Other objects of the invention are to provide such redundant resistor matching detector with constant percentage threshold; to provide such redundant resistor matching detector with constant percentage threshold substantially without negative effect and that overcome many of the disadvantages of prior art arrangements.

In brief, a redundant resistor matching detector is provided. The redundant resistor matching detector includes a voltage reference and a first operational amplifier, a second operational amplifier, a first potentiometer and a reference potentiometer. The first operational amplifier has a first input connected to a first potentiometer. The second operational amplifier has a first input connected to the reference potentiometer. The first operational amplifier and the second operational amplifier have a reference input coupled to the voltage reference. An input current mirror is coupled to the first potentiometer providing a first current. A first reference current mirror is coupled to the reference potentiometer providing a reference current. A second reference current mirror has an input coupled to a first output of the first reference current mirror and has a first output coupled to an output of the input current mirror. A pair of series connected resistors are connected between a second output of both the first reference current mirror and the second reference current mirror. A resistor is connected between a junction of the pair of series connected resistors and the first output of the input current mirror and the first output of the second reference current mirror.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

Figure 1:
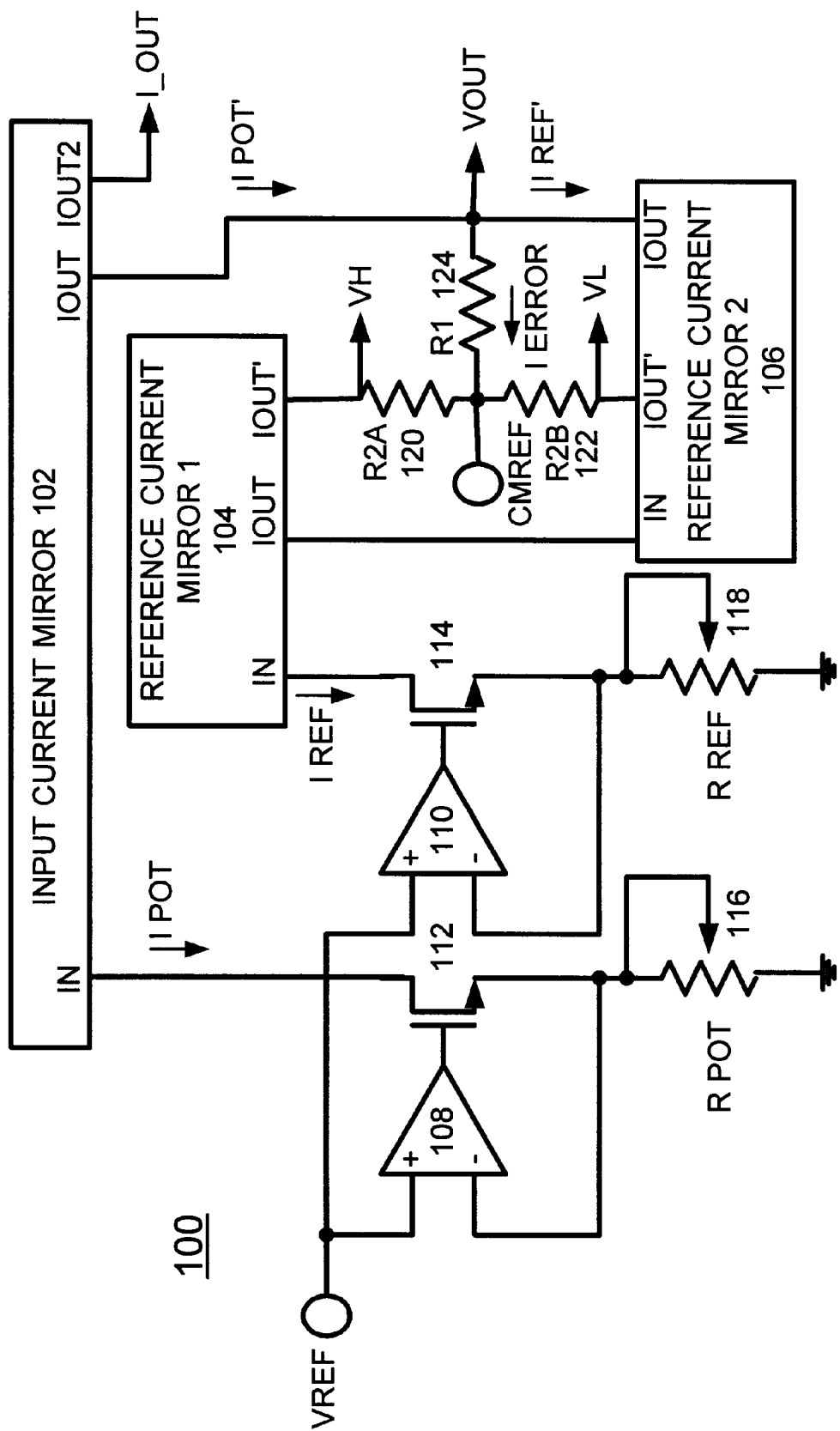
FIG. 1 is a schematic diagram representation of a redundant resistor matching detector with constant percentage threshold of the preferred embodiment.

Having reference to FIG. 1, there is shown a redundant resistor matching detector with constant percentage threshold of the preferred embodiment generally designated by 100. Redundant resistor matching detector 100 includes a first input current mirror 102, a pair of reference current mirrors 1 and 2, 104 and 106. A voltage reference VREF is applied to a reference input of a pair of operational amplifiers 108 and 110. A respective output of each operational amplifier 108 and 110 is connected to the gate of a respective N-channel field effect transistor 112, 114. The N-channel field effect transistor 112 is connected between the input current mirror 102 and a first potentiometer R POT 116. The N-channel field effect transistor 114 is connected between the first reference current mirror 104 and a reference potentiometer R REF 118. A pair of resistors R2A, R2B, 120,122 are connected in series between IOUT' outputs of the reference current mirrors 104 and 106. A resistor R1, 124 is connected between the output port VOUT and a junction of the series connected resistors R2A, R2B, 120,122.

Redundant resistor matching detector 100 generates three voltages VH, VL, and VOUT that are to be compared by two matched voltage comparators (not shown). An error signal is delivered if (VOUT>VH) or if (VOUT<VL). The two operational amplifiers 108 and 110 are matched and are referenced to the same voltage reference VREF so that when the operational amplifiers 108 and 110 are balanced, IPOT= VREF/R POT and IREF=VREF/R REF. IPOT and IREF are mirrored to the IOUT ports of the input current mirror 102 and the reference current mirror 1, 104, respectively. Reference current mirror 2,106 also mirrors its input current to its IOUT port. This results in two currents, I POT' which is proportional to I POT, and I REF' which is proportional to I REF. If the two potentiometers R POT and R REF, 116 and 118 are not matched, then I POT' and I REF' will also not match resulting in either a positive or negative error current I ERROR to flow through resistor R1, 124. The IOUT' ports of both reference current mirror 1, 104 and reference current mirror 2, 106 deliver a current proportional to I REF which is determined by R REF 118. This reference current is mirrored to I OUT' on mirror 1, 104 and mirror 2, 106. This current causes a voltage drop across resistors R2A and R2B, 120 and 122. This voltage drop determines the VH and VL levels which are to be used as the thresholds for the detecting comparators (not shown). The comparators would then signify an error if the I ERROR current increased enough to raise VOUT above VH or if the I ERROR current decreased enough to lower VOUT below VL. The threshold of the matching detector is controlled by the ratios of the resistors R2A, 120 and R2B, 122 over resistor R1, 124. Normally resistors R2A, 120 and R2B, 122 are equal.

An advantage of this redundant resistor matching detector 100 in the ideal case, is that it maintains a constant percentage threshold, independent of the absolute value of potentiometer R REF, 118. In other words, if you set the difference between VH and VOUT to be equal to 0, then the absolute value of potentiometer R REF, 118 falls out of the equation leaving only resistors R2A, R1, 120 and 124 and the percentage mismatch in the equation. If all the current mirrors 102, 104, and 106 are 1:1, the derivation is as follows:

$$VH = CMREF + (VREF/RREF)*R2A$$

$$VOUT = CMREF + (VREF/RPOT - VREF/RREF)*R1$$

If the percent difference, P=(RPOT−RREF)/RREF, then RPOT=RREF(P+1).

If you substitute for RPOT and subtract VOUT from VH and set to 0 to find the threshold, assuming detection using high gain differential comparators:

$$VH - VOUT = VREF/RREF*\{R2A - [1/(P+1) - 1]*R1\} = 0$$

$$R2A/R1 = -P/(P+1)$$

The ratio has a $-P$ in the numerator because the R2A resistor 122 is really establishing the threshold for when RPOT is less than RREF which results in P being negative.

For example, if all of the current mirrors were set at 1:1 mirror ratios, then to detect a $-10\%$ mismatch between RPOT and RREF potentiometers 116, 118, the ratio of R2A to R1 resistors 120, 124 should be:

$$R2A/R1 = -(-0.1)/(-0.1+1);$$

R2B=R2A for symmetric $+/-10\%$ detection.

The general equation for the ratio of R2A to R1 that takes into account that the current mirrors could have mirror ratios that are not 1:1 would be as follows:

$$R2A/R1 = (N/M)[-P/(1+P)];$$

R2B=R2A for symmetric $+/-P\%$ detection.
where N is the ratio of the IOUT current with respect to the IIN current in the mirrors and M is the ratio of the IOUT' current with respect to the IIN current in the mirrors.

One application for this redundant resistor matching detector 100 is in a laser driver circuit where it was desired to use automation to adjust digital potentiometers to trim the value of R POT 116, resulting in a functional average output power for the laser. For safety reasons, two digital potentiometers must be used in parallel since there can exist several failure mechanisms that could cause the R POT value to change in the digital potentiometer resulting in a unsafe optical output level from the laser. With the redundancy combined with the matching detector, the digital potentiometers can be used safely. The use of automation provides improved product quality, adjustment repeatability, and production efficiency above the use of mechanical potentiometers for the same application.

While the present invention has been described with reference to the details of the embodiments of the invention shown in the drawing, these details are not intended to limit the scope of the invention as claimed in the appended claims.

What is claimed is:

1. A redundant resistor matching detector comprising:

a voltage reference;

a first operational amplifier and a second operational amplifier, said first operational amplifier having a first input connected to a first potentiometer, said second operational amplifier having a first input connected to a reference potentiometer, said first operational amplifier and said second operational amplifier having a reference input coupled to said voltage reference;

an input current mirror coupled to said first potentiometer providing a first current;

a first reference current mirror coupled to said reference potentiometer providing a reference current;

a second reference current mirror having an input coupled to a first output of said first reference current mirror and having a first output coupled to an output of said input current mirror;

a pair of series connected resistors connected between a second output of both said first reference current mirror and said second reference current mirror; and a resistor connected between a junction of said pair of series connected resistors and said first outputs of said input current mirror and said second reference current mirror.

2. A redundant resistor matching detector as recited in claim 1 wherein said first current is mirrored to the first output of said input current mirror.

3. A redundant resistor matching detector as recited in claim 2 wherein said first current equals said reference voltage divided by a value of said first potentiometer.

4. A redundant resistor matching detector as recited in claim 1 wherein said reference current is mirrored to the first output of said first reference current mirror and said second reference current mirror.

5. A redundant resistor matching detector as recited in claim 4 wherein said first reference current mirror and said reference current mirror provide an output current to said pair of series connected resistors, said output current being proportional to said reference current.

6. A redundant resistor matching detector as recited in claim 1 includes a field effect transistor coupled between said input current mirror and said first potentiometer and a gate of said field effect transistor connected to an output of said first operational amplifier.

7. A redundant resistor matching detector as recited in claim 1 wherein a field effect transistor coupled between said first reference current mirror and said reference potentiometer and a gate of said field effect transistor connected to an output of said second operational amplifier.

8. A redundant resistor matching detector as recited in claim 1 wherein said pair of series connected resistors are matched resistors.

9. A redundant resistor matching detector as recited in claim 1 wherein said input current mirror provides an output current equal to said first current.

10. A redundant resistor matching detector as recited in claim 1 wherein said first reference current mirror provides an output current equal to said reference current.

11. A redundant resistor matching detector as recited in claim 10 wherein said second reference current mirror provides an output current equal to said reference current.

12. A redundant resistor matching detector as recited in claim 1 wherein said pair of series connected resistors connected between a second output of both said first reference current mirror and said second reference current mirror provide a voltage drop proportional to said reference current.

* * * * *